United States Patent [19]

Buchta

[11] 4,074,200
[45] Feb. 14, 1978

[54] CIRCUIT ARRANGEMENT FOR SELECTIVE FREQUENCY ANALYSIS OF THE AMPLITUDES OF ONE OR MORE SIGNALS

[75] Inventor: Karl Buchta, Munich, Germany

[73] Assignee: Siemens Aktiengesellschaft, Berlin & Munich, Germany

[21] Appl. No.: 741,849

[22] Filed: Nov. 15, 1976

[30] Foreign Application Priority Data

Dec. 10, 1975 Germany ............................ 2555602

[51] Int. Cl.² ............................................. H04B 1/36
[52] U.S. Cl. ..................................... 325/335; 325/67; 325/363; 325/470; 324/77 C
[58] Field of Search ................................ 325/332–337, 325/469, 470, 363, 6 T; 324/77 A, 77 B, 77 C, 77 CS

[56] References Cited

U.S. PATENT DOCUMENTS

| 2,954,465 | 9/1960 | White | 325/334 |
| 3,110,861 | 11/1963 | Hurvitz | 325/332 |
| 3,821,651 | 6/1974 | Fathauer et al. | 325/334 |

Primary Examiner—Robert L. Griffin
Assistant Examiner—Jin F. Ng
Attorney, Agent, or Firm—Hill, Gross, Simpson, Van Santen, Steadman, Chiara & Simpson

[57] ABSTRACT

A circuit arrangement for the frequency selective analysis of the amplitudes of one or more signals in which a selective receiver is automatically scanned through a given frequency band and the scanning speed of its frequency settings is controlled as a function depending upon the difference in amplitude of signal voltages consecutively received in time and including a second selective receiver is provided which has its frequency setting changed synchronously with that of the first receiver with a constant frequency spacing between the two receivers and with the frequency of the second receiver being ahead of the first receiver and including an analysis device connected to the second receiver to derive control signals.

9 Claims, 3 Drawing Figures

1

CIRCUIT ARRANGEMENT FOR SELECTIVE FREQUENCY ANALYSIS OF THE AMPLITUDES OF ONE OR MORE SIGNALS

BACKGROUND OF THE INVENTION

1. Field of the Invention

This invention relates in general to circuit arrangements for the frequency selective analysis of the amplitudes of one or more signals in which a selective receiver automatically passes through a given frequency band and the scanning speed of its frequency spacings is controlled by a value which is dependent upon the difference in amplitudes of adjacent signal voltages received consecutively in time.

2. Description of the Prior Art

There are known circuit arrangements which operate as receivers for scanning a frequency band and measuring with a selective receiver signals received over the frequency band and wherein the time differential of the amplitude changes is determined and used to change the scanning speed of the receiver. However, a disadvantage of such systems exist in that the determination of the time differential requires the processing of information to obtain a control value and the influence of the processing upon the scanning speed requires a rather long length of time during which the signal is analyzed before the frequency scanning speed is changed. Thus, these prior art systems require and include time delay which are undesirable.

SUMMARY OF THE INVENTION

The scanning speed of the present invention is changed so that the time required for changing the receiver from a rapid scan rate to a slower scan rate with high selectivity is eliminated. In the present invention, those portions of the frequency band which are not filled with signals or only contained signals which have substantially constant amplitudes are scanned relatively rapidly wherein the frequency scanning speed is substantially slowed down in those areas of the spectrum which possess numerous signals or signal components which have substantial amplitude changes.

It is an aim of the present invention to provide a circuit arrangement which very rapidly changes from rapid frequency scanning to slower frequency scanning wherein the signals are such that such change should occur. In the present invention, a pair of selective receivers are provided with the second selective receiver having a frequency setting which is changed in synchronous with that of the first receiver but wherein the receivers have a constant frequency spacing between them and the tuning frequency of the second receiver leads that of the first receiver and wherein an analyzing device is connected to the output of the second receiver so as to derive control signal values.

The advantage of the present invention consists in that the selection of a scanning speed with a sufficiently small band width of the first receiver fulfills the essential prerequisites of an accurate analysis of the signal amplitudes whereas the additional provisions which reduce the large time required for making the precision measurements do not degrade the measuring results. In the event a step change in the frequency settings of the two receivers is utilized the circuit arrangement in accordance with the invention will be very advantageous for use in programmable step control automatic measuring devices. On the other hand, if continuous frequency scanning is utilized it will be particularly advantageous if a pictorial representation of the amplitude excursions of the received signals is desired.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
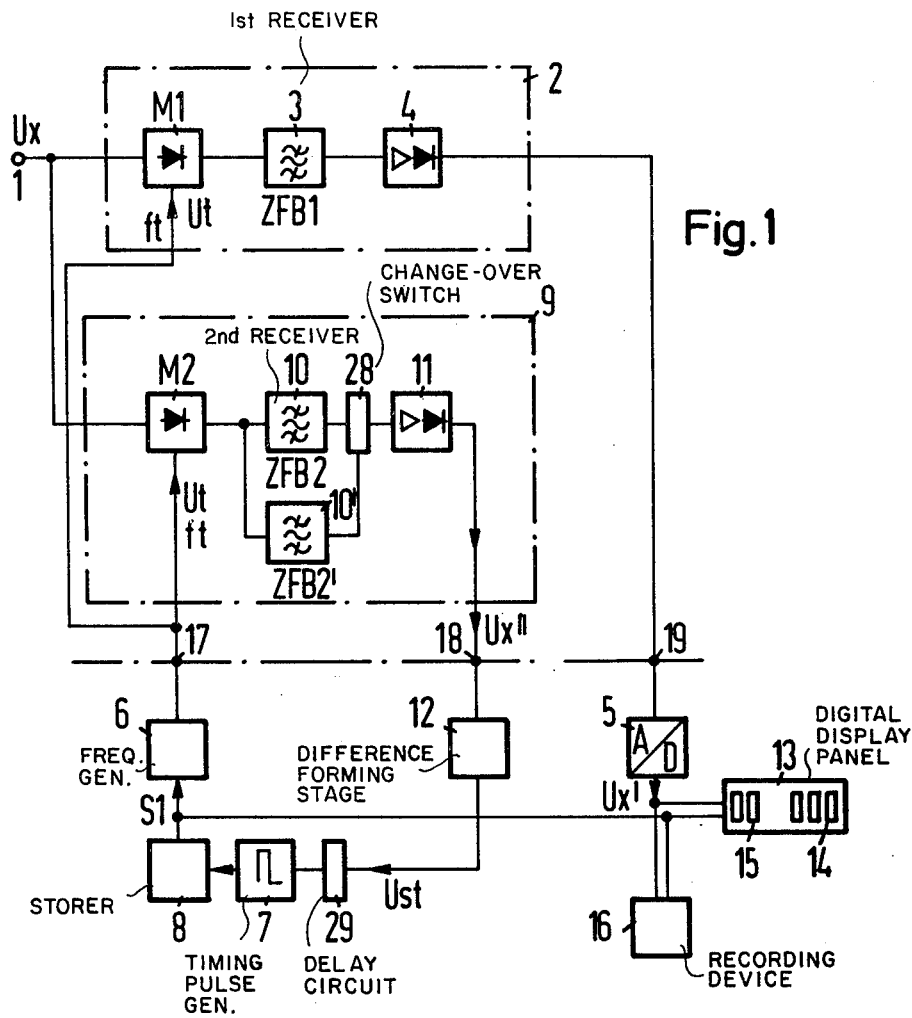
FIG. 1 is a block diagram of a selective receiver designed according to the invention.
Figure 1:
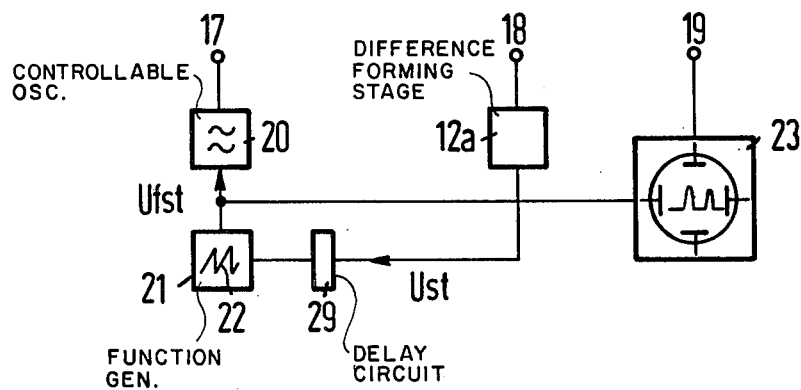

FIG. 1 illustrates an input terminal to which signals $Ux$ are supplied and these signals are to be analyzed with regard to their amplitude excursions as a function of frequency. These signals are supplied to input terminal 1 of a tunable selective heterodyne receiver 2. In order to tune receiver 2 over a plurality of frequencies within a given frequency band a mixer M1 is connected to terminal 1 and receives a second input comprising an injection voltage $Ut$ having an adjustable frequency $ft$. The output of the mixer is supplied to an intermediate frequency band pass filter ZFB1, and the signals $Ux$ are converted in the mixer M1 into the intermediate frequency band ZFB1 which is defined as the pass band curve of the highly selective band pass filter 3. An amplifier and rectifier in an analogue stage 4 receives the output of the band pass filter 3 and supplies an output to terminal 19 which is connected to the input of an analogue to digital converter 5 which provides output digital signals $Ux'$ derived from the voltage $Ux$. The voltage signals $Ux'$ represent an indication of the amplitudes of the signals or signal components from the signal $Ux$ to which the receiver 2 is tuned. For automatic frequency scanning of the receiver 2 the mixer M1 is fed with a series of carrier voltage signals $Ut$ produced by a frequency generator 6 which can be a synthesizer which has frequency values which rise or fall in steps or stages.

These carrier or tuning voltages produced by the generator 6 are triggered by a train of digital signals S1 which are produced by the storer 8 which supplies an output to the generator 6 and which is triggered by timing pulse generator 7. The storer 8 is preprogrammed to a desired sequence of tuning frequencies.

Thus, the selective receiver 2 automatically scans over a given frequency band which, for example, is to be investigated relative to the occurrence of the signals $Ux$ and the receiver is tuned over a sequence of frequency settings determined by the digital signals S1 and with a selectivity determined by the band width of the filter 3.

The scanning speed of the individual frequency settings depends upon the repetition frequency of the timing pulse generator 7.

In order to achieve a frequency scan which inspite of the high selectivity of the receiver 2 saves time, the repetition frequency of 7 is selected such that it produces signals which cause the scanning over frequency sub-bands which are not filled with signals $Ux$ or only contained signals $Ux$ without any fundamental amplitude changes in relatively large steps. On the other hand, when frequency sub-bands have a substantial number of signals $Ux$ or where the fundamental amplitudes change the frequency sub-bands are reduced for accurate analysis of the amplitude measured values $Ux'$ which are obtained so as to take into account the build-up times occurring as a result of the narrow band of the filter 3.

The reduction and the repetition frequency of the timing pulse generator 7 is determined by the amplitude differences of the signal voltages received consecutively in time and is accomplished as follows.

A second selective heterodyne receiver 9 which contains a mixer M2 also receives the input signal $Ut$ at a frequency of ft from terminal 17 at the output of the generator 6. An intermediate frequency band pass filter 10 receives the output of the mixer M2 and has a pass band of ZFB2. An amplifier and rectifier stage 11 receives the output of the filter 10 and supplies an output signal $Ux''$ to terminal 18. Since the generator 6 supplies inputs to both the mixers M1 and M2 the receivers 2 and 9 will be simultaneously tuned in synchronism and the tuning frequencies of the two receivers 2 and 9 will differ by a constant frequency amount. This is caused by feeding the same carrier voltage $Ut$ to the mixers M1 and M2 and the intermediate frequency band ZFB2 defined by the band pass filter 10 is selected to be substantially wider than the intermediate frequency band ZFB1 which is the pass band of the filter 3 and which is displaced by the desired frequency amount.

The pass band frequency ZFB2 is also displaced relative to the pass band ZFB1 in the direction of the frequency axis such that the relevant tuning frequency of receiver 9 will with a scanning through in the direction of rising frequencies exceed the tuning frequency of receiver 2 by a constant frequency amount, but in the event of a scan-through in the direction of falling frequencies will undershoot the tuning frequency of receiver 2 by the same constant frequency amount. This means that the receiver 9 always leads the receiver 2 in respect to its frequency settings.

If the frequency band is scanned through alternately in opposite directions during the upward frequency scan the intermediate frequency band pass filter 10 serves to select the signals $Ux$ received in receiver 9 whereas in the return scan a further intermediate frequency band pass filter 10' illustrated in FIG. 1 makes the appropriate selection at the intermediate frequency band ZFB2'. This frequency is displaced by double the amount of frequency lead of the pass band ZFB2.

A change-over switch 28 ensures that in each case only the output voltages of the currently required filter 10 or 10' are fed to the input of the amplifier and rectifier stage 11. The amplified and rectified signal voltages $Ux''$ which have been selected by means of the receiver 9 are then fed to a difference forming stage 12 which derives a control voltage $Ust$ which is dependent upon the amplitude difference of the signal voltages $Ux''$ which are received consecutively in time. $Ust$ is then fed through a delay circuit 29 to the control input of the timing pulse generator 7 which causes the repetition frequency to be adjusted. The difference forming stage 12 can expediently contain a storer into which consecutively received signals $Ux''$ are input in serial fashion and which emits the stored output in parallel at two outputs. A differential amplifier can receive these outputs to form the control voltage $Ust$. The delay circuit 29 itself casues the repetition frequency of the timing pulse generator 7 not to be reduced until the receiver 2 has reached the tuning position in which the receiver 9 has previously determine the triggering amplitude difference of $Ux$.

As described above, a frequency scan through by the receiver 2 is accomplished which is matched to the amplitude excursions of the signal $Ux$ over the frequency band and which ensures an accurate analysis of the signals $Ux'$ depending upon variations in frequency. The analyzing device may, for example, comprise a digital display panel 13 in which a digit display 14 of the amplitudes of the signal $Ux$ can be compared with the digit display 15 obtained from digital signals S1 of the assigned tuning frequency of the receiver 2. Alternatively, the analyzing device can take the form of a recording device 16 such as a page printer.

As a modification of the circuit illustrated in FIG. 1 the constant frequency spacing between the tuning frequencies of the two receivers 2 and 9 can also be achieved by providing a frequency generator 6 which simultaneously emits two different carrier voltages $Ut$ which in each case differ by the desired frequency spacing and which are then individually supplied to the mixers M1 and M2. In this event, the intermediate frequency bands ZFB1 and ZFB2 need not be displaced relative to each other and the frequency difference of the tunings of the receivers 2 and 9 can be freely selected in digital fashion in the frequency generator 6 in a known manner.

If the circuit illustrated in FIG. 1 is broken at circuit points 17, 18 and 19 illustrated in FIG. 1, the portions of the circuit in FIG. 1 lying below the line determine by the line passing through points 17, 18 and 19 can be replaced by the alternative embodiment illustrated in the lower portion of FIG. 1 wherein terminals 17, 18 and 19 are also illustrated. This replacement of the sub-circuit illustrated in the lower part of FIG. 1 allows a continuous frequency scan through by the receivers 2 and 9. The frequency generator 6 is replaced by a controllable oscillator 20 which has a frequency that can be varied depending upon a frequency control voltage $Ufst$ which is supplied by a function generator 21. The function generator 21 might produce a saw-tooth voltage 22 and its gradient can be varied by means of a control voltage $Ust$ which is fed through a delay circuit 29 and which is obtained in a stage 12a which serves to analyze the time differential of the voltages $Ux''$ in a manner such that the scanning speed is reduced according to the amplitude variations of $Ux$ over the frequency band. If the output voltage of the receiver 2 is fed to terminal point 19 and is supplied to one deflecting means of a visual display or recording device 23 which might be a cathode ray oscilloscope or a XY printer and if the other deflecting means receives the signal $Ufst$ from the output of the generator 21, a relatively high speed and yet extremely accurate recording of the amplitude excursions of the signal $Ux$ over the frequency band can be achieved.

Figure 2:
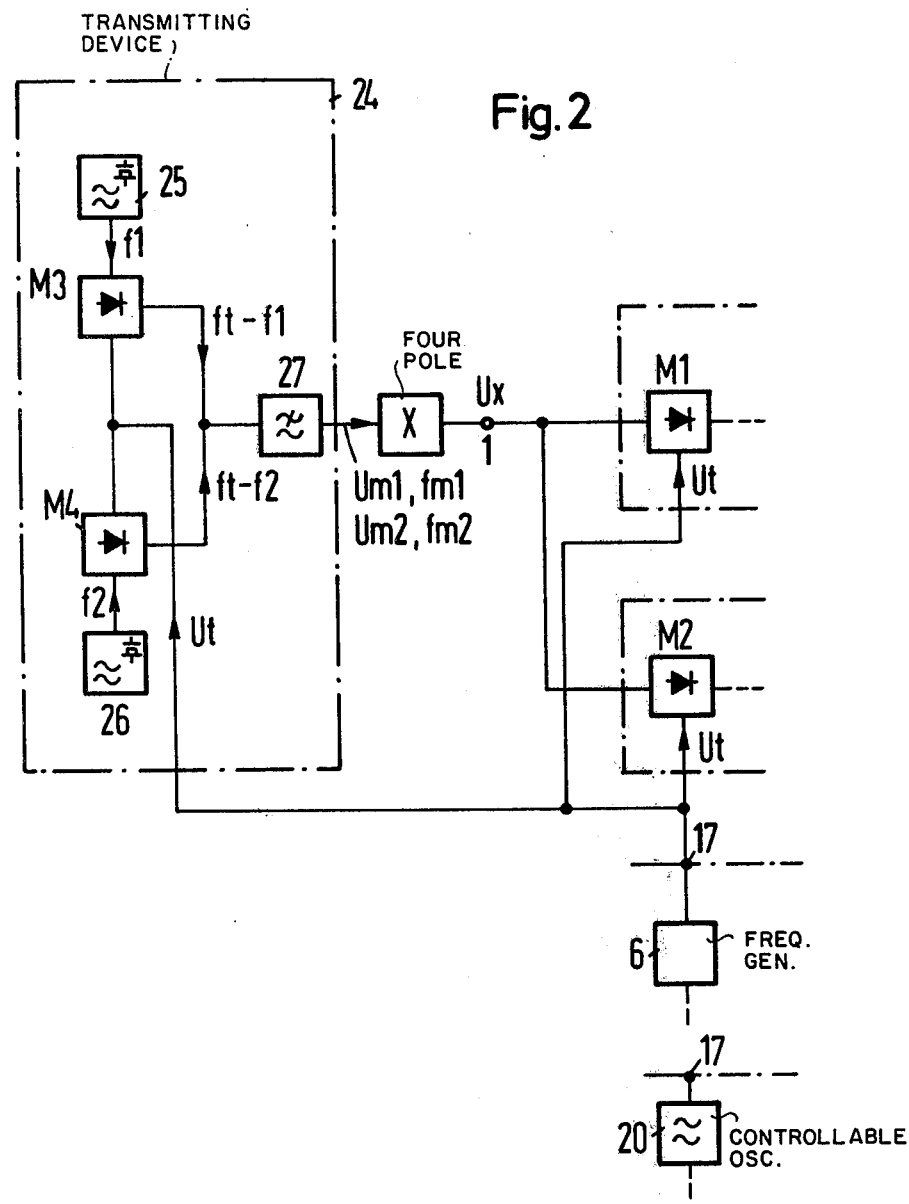
FIG. 2 is a block diagram of a measuring installation according to the invention.

FIG. 2 illustrates a measuring installation wherein the receiving portion is located on the right side of the terminal 1 corresponds to the circuits illustrated in FIG. 1 and are constructed and operated as described relative to FIG. 1. The voltages $Ux$ which are supplied to terminal 1 are derived from two voltages $Um1$ and $Um2$ produced in a transmitting device 24. The output of the transmitting device 24 comprising the frequencies $Um1$ and U$m$2 are supplied to a four pole X which is to be measured relative to its transmission parameters. The circuit components 6 which comprises the frequency generator and a controllable oscillator 20 provide for a stepped or continuous frequency scan through by the receiver 2 and simultaneously also controls the frequency changes in the voltages U$m$1 and U$m$2 produced in the transmitting device 24 and these signals are supplied from terminal 17 into the transmitting device as illustrated in FIG. 2 so that a synchronized operation will be achieved. A pair of mixers M3 and M4 receive on their first inputs the carrier tuning voltage U$t$ from terminal 17. The second inputs of the mixers M3 and M4 receive the outputs of quartz stabilized oscillators 25 and 26 respectively. The fixed frequencies $f1$ and $f2$ supplied by the oscillators 25 and 26 are selected such that they correspond to the middle frequencies of the band pass filters 3 and 10 in the receivers 2 and 9. The outputs of the mixers M3 and M4 are supplied to a low pass filter 27 which selects the frequencies $fm1 = ft - f1$ and $fm2 = ft - f2$. The mixed frequency products of these frequencies are fed as the voltages U$m$1 and U$m$2 to the four pole X.

The signal U$m$2 to which the receiver 9 is automatically tuned represents a pilot signal with a leading frequency $fm2$ which serves to supply the control voltage U$ft$ for the reduction of the scanning speed depending on the amplitude excursions of U$x$ whereas the signal U$m$1 with the frequencies $fm1$ which lacks the frequency amount $f2 - f1$ serves as an actual measuring signal and in the receiver 2 is analyzed in a frequency selective manner as described relative to FIG. 1 above.

Figure 3:
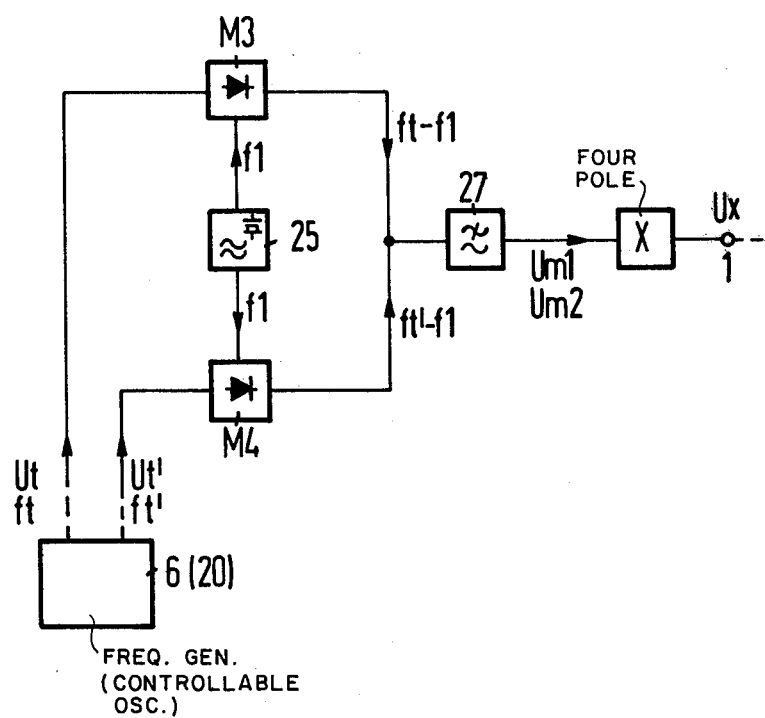
FIG. 3 illustrates a modification of the circuit of FIG. 2.

In the event that the mixers M1 and M2 are supplied with two carrier voltages U$t$ and U$t'$ displaced from one another in frequency by the amount of the desired frequency lead of U$m$2 and simultaneously the intermediate frequency band filters 3 and 10 are tuned to one and the same middle frequencies, these carriers voltages U$t$ and U$t'$ will according to FIG. 3 be fed to the mixers M3 and M4 as shown. In this example, since both the oscillators 25 and 26 will produce the same fixed frequency one of them can be eliminated and one of them such as the oscillator 25 can supply injection inputs to both of the mixers M3 and M4 as shown in FIG. 3.

It is seen that this invention provides a novel and improved testing device for the frequency selective analysis of the amplitudes of one or more signals and although it has been described with respect to preferred embodiments it is not to be so limited as changes and modifications may be made therein which are within the full intended scope as defined by the appended claims.

I claim as my invention:

1. A circuit arrangement for frequency-selective analysis of the amplitudes of one or more signals in which a first selective receiver automatically scans through a given frequency band, and the scanning speed of its frequency settings is controlled by means of a control signal value which is dependent upon the amplitude difference of signal voltages received consecutively in time, comprising a second selective receiver which has its frequency setting changed in synchronism with the first receiver and with a constant frequency spacing maintained between the instantaneous tuning frequencies of said first and second receivers and the tuning frequency of said second receiver leading the tuning frequency of said first receiver and an analysis device receiving the output of said second receiver for determining the amplitude difference of signal voltages received consecutively in time and deriving the said control signal value and supplying it to said first and second receivers.

2. A circuit arrangement according to claim 1 including first and second mixers, respectively mounted in said first and second selective receivers, a frequency generator connected to said first and second mixers and producing carrier voltages with frequencies which rise or fall in steps and first and second intermediate frequency band pass filters respectively connected to said first and second mixers and each tuned to center frequencies which differ from one another by said constant frequency spacing.

3. A circuit arrangement according to claim 1, wherein first and second mixers are respectively mounted in each of said first and second selective receivers and a frequency generator supplying said two mixers with carrier voltages having frequencies which rise or fall in steps and which exhibit said constant frequency spacing from one another, and first and second intermediate frequency band pass filters connected to the outputs of said first and second mixers and tuned to the same center frequency, but wherein said filters have different band widths.

4. A circuit arrangement according to claim 3 wherein a storage means causes said frequency generator with a pre-programmed sequence of digital signals to emit carrier voltages and said digital signals are emitted from said storage means, a timing pulse generator for triggering said storage means, a difference forming circuit, the output voltages which occur at the output of said second selective receiver are fed to said difference-forming circuit which from the amplitude difference of two consecutively received signal voltages forms a control voltage which is connected to said timing pulse generator by a delay means.

5. A circuit arrangement according to claim 1 including first and second mixers mounted in said first and second selective receivers a controllable oscillator connected to said first and second mixers and commonly supplying a carrier voltage of variable frequency thereto, first and second intermediate frequency band pass filters connected to said first and second mixers and each tuned to center frequencies which differ by said constant frequency spacing and wherein said filters possess different band widths.

6. A circuit arrangement according to claim 1 wherein said signal which is to be analyzed consists of the output voltage of a four-pole which is to be checked in respect of its transmission parameters, and a transmitting device provided which feeds said four-pole with a pilot voltage which in frequency conforms with the tuning frequency of said second receiver and in frequency conforms with the tuning frequency of said first receiver.

7. A circuit arrangement according to claim 6, wherein said transmitting device contains third and fourth mixers, similarly to said first and second mixers of the first and second receivers are fed with said carrier voltage from said frequency generators and that further inputs of said third and fourth mixers are supplied with individually assigned fixed frequencies which correspond to the middle frequencies of intermediate frequency band pass filters and that mixed products formed in said third and fourth mixers with the differnce frequencies of said carrier voltage frequencies, and the fixed frequencies are fed to said four-pole as a pilot voltage and as a measuring voltage.

8. A circuit arrangement as claimed in claim 7 wherein the signal voltages which occur at the output of said first selective receiver are digitalized, and a digital visual display or a recording device receiving the output of said first receiver and with reference to the tuning frequencies of said first receiver recording the output thereof.

9. A circuit arrangement according to claim 7 including a visual display or recording device with first and second deflecting means and the voltages which occur at the output of said first selective receiver are fed to said first deflecting device and a function generator supplying an output to said second deflecting device.

* * * * *